(12) United States Patent
Lee (10) Patent No.: US 9,099,165 B1
(45) Date of Patent: Aug. 4, 2015

(54) SINGLE CHIP MIXED MEMORY FOR DYNAMIC REPLACEMENT OF DRAM BAD CELL

(71) Applicant: Inphi Corporation, Santa Clara, CA (US)

(72) Inventor: Chien-Hsin Lee, Santa Clara, CA (US)

(73) Assignee: Inphi Corporation, Santa Clara, CA (US)

( * ) Notice: Subject to any disclaimer, the term of this patent is extended or adjusted under 35 U.S.C. 154(b) by 400 days.

(21) Appl. No.: 13/791,792

(22) Filed: Mar. 8, 2013

Related U.S. Application Data

(60) Provisional application No. 61/641,417, filed on May 2, 2012.

(51) Int. Cl.
*G11C 29/04* (2006.01)
*G11C 8/06* (2006.01)
*G11C 16/08* (2006.01)

(52) U.S. Cl.
CPC . *G11C 8/06* (2013.01); *G11C 16/08* (2013.01)

(58) Field of Classification Search
CPC .... G11C 29/04; G11C 29/808; G11C 29/846; G11C 29/44
See application file for complete search history.

(56) References Cited

U.S. PATENT DOCUMENTS

| | | | | |
|---|---|---|---|---|
| 6,603,690 | B1* | 8/2003 | Chen et al. | 365/200 |
| 2008/0181035 | A1* | 7/2008 | Kawasumi | 365/200 |
| 2009/0161429 | A1* | 6/2009 | Chen et al. | 365/185.09 |
| 2012/0221902 | A1* | 8/2012 | Ware et al. | 714/710 |

* cited by examiner

*Primary Examiner* — Jigar Patel
(74) *Attorney, Agent, or Firm* — Richard T. Ogawa; Ogawa P.C.

(57) ABSTRACT

A memory device comprising an interface device and a plurality of memory arrays. The interface device includes an address match table comprising at least a revised address corresponding to a spare memory location and a control module configured to determine address information from the address stream from an address command bus coupled to the host controller during a run time operation. The control module is configured to compare each address from the address stream and determine whether each address matches with a stored address in the address match table to identify a bad address and configured to replace the bad address with the revised address of the spare memory location. The device also has a plurality of memory arrays. Each of the memory arrays comprises a plurality of memory cells. The memory device has a spare group of memory cells comprising a plurality of spare memory cells. Each of the plurality of spare memory cells being addressable using the address match table.

20 Claims, 9 Drawing Sheets

FIGURE 1

| Rank ID | Bank ID | Row Address | Column Address | | Spare ID |
|---|---|---|---|---|---|
| 0 | 3 | 0x0A81 | 0x00C1 | | 0 |
| 0 | 3 | 0x1BC1 | 0x01E0 | | 1 |
| 1 | 0 | 0x0C03 | 0x032D | | 1 |
| 1 | 1 | 0x0047 | 0x0004 | | 0 |
| 1 | 1 | 0x0161 | 0x00CC | | 0 |
| 1 | 2 | 0x1958 | 0x006E | | 0 |
| 1 | 2 | 0x04DA | 0x01E9 | | 1 |
| 1 | 3 | 0x098C | 0x000E | | 1 |

SINGLE CHIP MIXED MEMORY FOR DYNAMIC REPLACEMENT OF DRAM BAD CELL

CROSS-REFERENCES TO RELATED APPLICATIONS

The present application claims priority of and incorporates by reference, for all purposes, the following patent application: U.S. Pat. App. No. 61/641,417, filed May 2, 2012.

BACKGROUND OF THE DISCLOSURE

The present invention relates generally to solid state memory techniques. More particularly, the present invention provides methods and devices for repairing a "bad memory cell" with a substitute cell for a memory device such as a dynamic random access memory ("DRAM") device or others.

In memory systems, two general classes of memories exist. Such classes include low latency memories. The low latency memories have effectively infinite endurance or usage-cycles and do not degrade with respect to age or repeated accesses. Additionally, such classes also include relatively longer latency memories that do not have infinite endurance or usage cycles, and may degrade with respect to age or repeated accesses. In the case of the relatively long latency memories, sophisticated multi-error detection and correction algorithms have been implemented to correct for data cells that can degrade over the lifetime of the device due to aging effects or repeated accesses. In the case of low latency memories such as DRAM devices, however, effectively infinite endurance or usage-cycles are assumed so once weak bits or bad bits are mapped out by the device manufacturer, no errors should occur due to degradation of data cells due to aging effects or repeated accesses.

As is known, the conventional DRAM memory cell has an access transistor and a storage capacitor. The access transistor connects with the storage capacitor to a bitline when switched-on such that the capacitor stores the logic value placed on the bitline. Due to the tendency of a capacitor to lose its charge over time, DRAM memory cells must be periodically 'refreshed', which serves to maintain the value stored in each storage capacitor at its desired value. The amount of time that a cell can retain its logic value is referred to as its "data retention time".

A trend in the development of memory cells is that the cells have been shrinking due to advancements in process technology and the demand for ever larger memory capacity. This necessarily results in a reduction in the sizes of the access transistor and storage capacitor, which can lead to several limitations. For example, each access transistor exhibits leakage which acts to slowly drain stored charge from the storage capacitor. This leakage characteristic—and thus each cell's data retention time—varies from transistor to transistor; however, this variability increases as the size of the access transistors is reduced. Another problem is that a shrinking memory cell results in a smaller storage capacitor, and thus a reduced storage capacitance. This can also adversely affect the data retention time characteristics of the cells.

BRIEF SUMMARY OF THE INVENTION

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

In an embodiment, the present invention provides a memory interface device. This device can include address input(s), address output(s), an address match table, a control module, and a multiplexer. In a specific embodiment, the memory interface device can be selected from a register device, a buffer device, an advanced memory buffer, a buffer on-board, or the like and combinations thereof.

The address input(s) can be configured to receive address information from an address stream of a host controller, while the address output(s) can be coupled to a plurality of memory devices and be configured to drive address information. In a specific embodiment, the plurality of memory devices can include a plurality of DRAM devices, Flash devices, or other like memory devices. Furthermore, the multiplexer, which can be a MUX or DEMUX, can be coupled to the address input and the address output.

The address match table can include an array of SRAM cells, or the like. In a specific embodiment, this address match table can include a plurality of bad address information and a plurality of spare memory locations. Each of the plurality of bad address information can be associated with one of the plurality of spare memory locations. Each of the plurality of bad address information can include a rank ID, a bank ID, a chip ID, a row address, and a column address. Additional parameters can also be included, such as offset ID. Each of the plurality of spare memory locations can include a first column, second column, and an nth column. Various numbers and configurations of spare memory locations can be used depending on design and related applications. The address match table can be configured to receive bad address information and can be configured to transfer the spare memory location to replace the bad address associated with the bad address information.

The control module can be a command and address module, or the like. This control module can be integrated with the address match table. In a specific embodiment, this control module can be configured to determine address information from an address stream from an address command bus coupled to a host controller during a run time operation. This control module can be configured to compare each address from the address steam and configured to determine whether each address matches with a stored address in the address match table to identify a bad address. The control module can also be configured to replace the bad address with the revised address of the spare memory location.

In a specific embodiment, the control module can include an input receiver module or a control and status register module. The control module can also include an input command, an input address, and an input chip-select decoder module. Other components, such as a parity checking module, a signal inversion module, a signal delay module, a PLL (Phase-locked loop), a command and address control module, an input buffer termination module, a clock stop power down module, a reset module, and the like, can also be included with the memory interface device.

In a specific embodiment, the memory interface device can be coupled to a plurality of DRAM devices. Each of these DRAM devices can include a plurality of address inputs, a plurality of control inputs, a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can be consisted of one or more spare rows, one or more spare columns, or one or more spare banks.

In an embodiment, the present invention can provide a memory integrated circuit device. This device 500 can include a plurality of regular address inputs, at least one spare address configured for a selected mode or an unselected mode, a plurality of control inputs, a plurality of data inputs, a plurality of data outputs, a plurality of memory arrays, and a spare group of memory cells.

In a specific embodiment, each of the plurality of memory arrays can include a plurality of memory cells. Each of these memory cells can be coupled to a data input/output. Also, the spare group of memory cells can include a plurality of spare memory cells. The spare group of memory cells can include one or more spare rows, one or more spare columns, one or more spare banks, or the like. Each of these memory cells can be externally addressable using an address match table and can be configured with the spare address input. The spare address input can be coupled to the address match table to access the spare memory cells. In a specific embodiment, the spare address input can include one of three unused column address inputs A11, A13, and A17.

In a specific embodiment, the plurality of spare memory cells can be accessed from the group of memory cells using the spare address input during the selected mode. During a read operation, data from the accessed spare memory cell can be transferred to one of the plurality of data outputs. During a write operation, data from one of the plurality of data inputs can be transferred into the accessed spare memory cell. During the unselected mode, the spare address input can remain inactive while the plurality of regular address inputs remains active.

Also, the spare group of memory cells can include various configurations of spare columns and spare address inputs. For example, the spare group can include first through seventh spare columns, and the spare address input can include first through third spare address inputs. Or, the spare group can include first through third spare columns, and the spare address input can include a first and second spare address input. Other variations, modifications, and alternatives to these configurations can be used.

The memory integrated circuit device can also include an encoded command and address bus having a shared command signal and an address signal, an internal data input reference voltage circuit, a command and address parity checking circuit, a set of circuits designed to support connectivity testing, a reset input signal, a set of multi-purpose status registers configured to be read out, or the like and combinations thereof.

In an alternative embodiment, the integrated memory circuit device also includes a dedicated array of memory cells implemented within the middle of the plurality of DRAM devices without additional spare memory cells for bit repair. These dedicated memory cells are controlled by a logic circuitry which functions as a match table and causes an address to a defective cell in any of the plurality of DRAM devices to be rerouted to a particular one of the dedicated array of memory cells. These dedicated memory cells preferably include no weak cells as they can be made by DRAM with bigger feature sizes or by non-volatile memory devices such as SRAM. The logic is also preferably made from non-volatile memory devices arranged to provide byte, nibble or bit granularity.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications. Additional benefit lies in an implementation of a dedicated array of memory cells in the integrated DRAM memory devices to eliminate inefficient spare rows and/or columns of cells, which recovers about 5% silicon area on the integrated memory chips and improve the efficiency of defective cell repair or replacement.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF SPECIFIC EMBODIMENTS OF THE DISCLOSURE

A trend in the development of memory storage devices is that as the storage cells continue to shrink due to advancements in process technology, storage cells in low latency memories such as DRAM devices may become more susceptible to errors that occur due to aging effects or repeated accesses. Moreover, the number of weak bits due to natural process variations will continue to increase. Accordingly, it is desirable that spare storage cells can be utilized to correct for the presence of faulty storage cells in low latency memory that may develop over the lifetime of the device.

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

A system and method are provided for replacing faulty or weak memory storage cells in a memory system through the use of an enhanced memory interface circuit or enhanced memory controller device and the use of redundant memory storage cells.

The present invention provides for a method that may be implemented in different ways for different systems. An implementation is described herein as an illustrative example. The example should not be construed as limiting the scope of the claims according to the present invention.

In an example, the present techniques provide for support of bad cell management in DRAM devices. It is believed that as DRAM process technology continue to advance, DRAM cell storage capacitance will continue to decrease and more and more DRAM storage cells will be unable to meet specified data retention time requirements. Furthermore, as the number of bad DRAM storage cell increases, DRAM devices as a whole will be unable to provide sufficient number of redundant rows and redundant columns to continue to effect repairs and present the façade of perfect storage devices. According to the present example, the techniques provide logic devices coupled with DRAM memory cells to help healing ailing DRAM devices and mitigate the ill effects of the bad DRAM cells. Further details of the present system and method can be found throughout the present specification and more particularly below.

EXAMPLE

Figure 1:
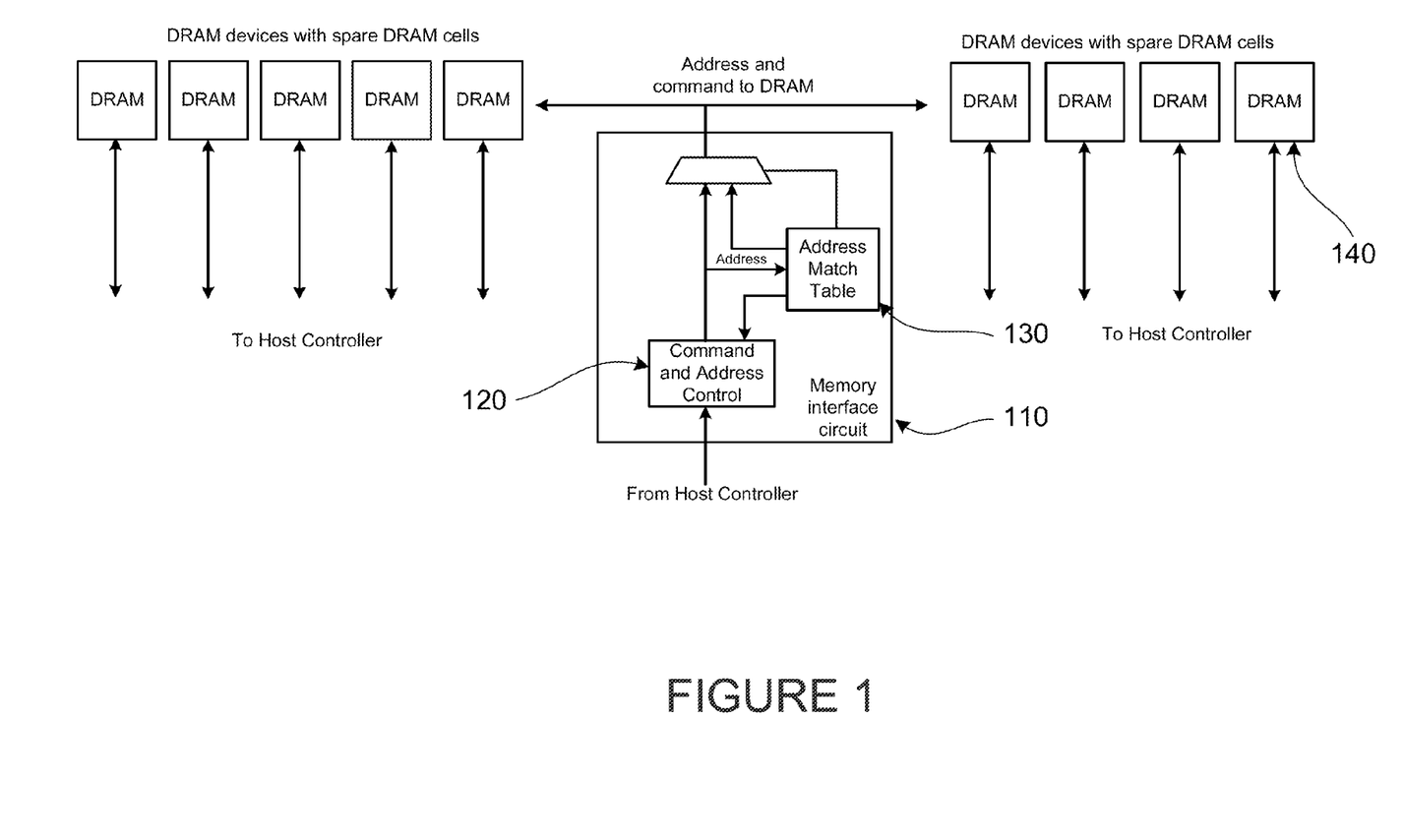
FIG. 1 illustrates a simplified block diagram of an interface circuit according to an embodiment of the present invention.

Utilizing an Address Match Table in Memory Interface Circuit, Controlling Spare Memory Storage Cells to Dynamically Replace Faulty Storage Cells in Memory Devices, as illustrated by FIG. 1.

FIG. 1 shows an example of use of an enhanced interface circuit that, in combination with spare cells in DRAM devices, can function to replace faulty memory locations in the DRAM devices. In FIG. 1, an enhanced memory interface circuit, labeled as 110 is shown to contain a command and address control unit, labeled as 120, and an Address Match Table, labeled as 130. The enhanced memory interface circuit re-drives addresses and commands from the host controller to the DRAM devices, one of which is labeled as 140 in FIG. 1. The DRAM devices contain spare DRAM cells, the addresses of which the enhanced memory interface circuit can select and effect the replacement of faulty or weak storage cell locations, as illustrated by the Table in FIG. 2.

As an example, the DRAM device may include a plurality of memory cell arrays, a plurality of switch blocks, and a plurality of sensing amplifying units. Each of the memory cell arrays includes at least one memory cell, and each memory cell may be connected to a word line and a bit line. Of course, other features exist with the DRAM device.

Figure 2:
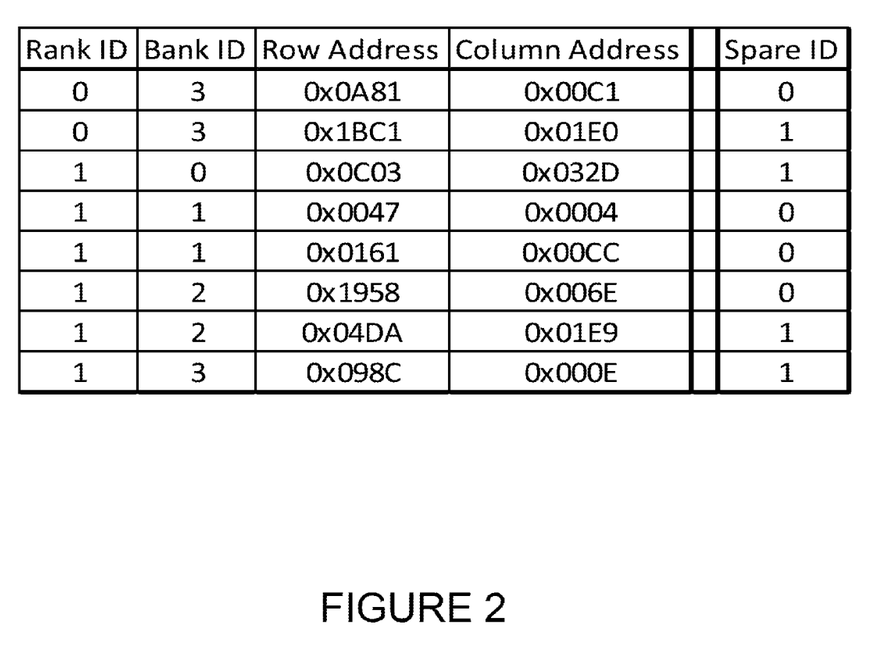
FIG. 2 illustrates a simplified Address Match Table according to an embodiment of the present invention.

FIG. 2 shows an example of the Address Match Table, labeled as 130 in FIG. 1. FIG. 2 shows that the Address Match Table contains addresses of faulty memory storage cells. In the case of FIG. 2, the addresses are listed in terms of DRAM address formats: Rank ID, Bank ID, Row Address and Column Address. The reference spare ID can be "0" or "1," although there can be variations. The spare ID may be used to indicate data bus offset as to select subset(s) of DRAM devices to respond to the selection of a spare location. For example, the offset ID may indicate, for example, that: only the left side of the memory module should be matched against the bad memory address, only the right side of the memory module should be matched against the bad memory address, the entire width (one rank) of the memory module should be matched against the bad memory address, or a single DRAM device should be matched against the bad memory address.

In other implementations, address fields for Chip ID (CID) and Bank Group ID may also be used. The addresses of faulty or weak memory storage cells contained in the Address Match Table may be determined by testing during manufacturing or special run-time testing. The entries in the Address Match Table may also be dynamically updated during runtime if it is determined that additional memory storage locations are weak or faulty. The function of the Address Match Table is to act as a filter of addresses and commands that flow through the enhanced memory interface circuit 110. In the case that a given memory access is matched to an entry in the Address Match Table, the Address Match Table replaces the address of the memory access with the address of a spare memory location. In this manner, the existence of the faulty or weak memory address is hidden from the host memory controller, and the enhanced memory interface circuit enables the memory devices to present a contiguous memory address space without faulty or weak cell locations, as shown in FIG. 3.

Figure 3:
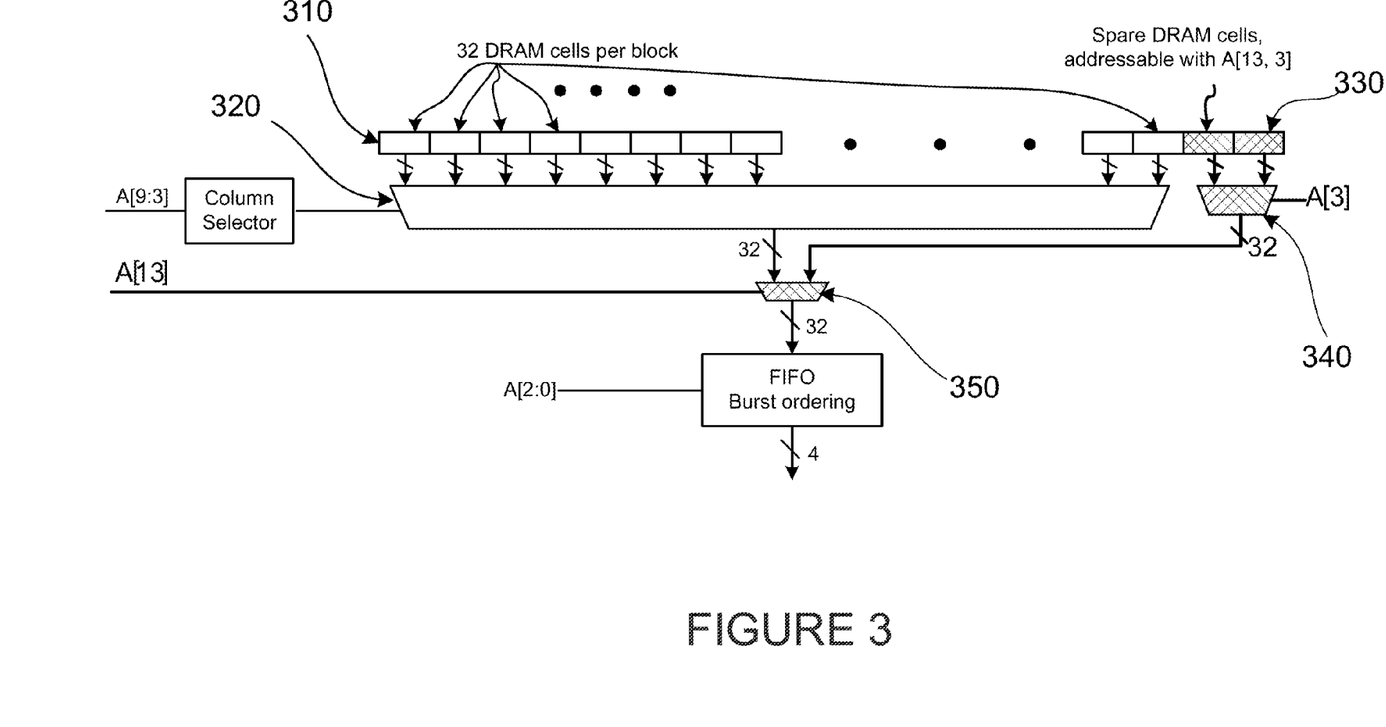
FIG. 3 illustrates a simplified diagram of spare memory cells in a DRAM device according to an embodiment of the present invention.

FIG. 3 shows an exemplary implementation of spare memory cells in a DRAM device. The spare memory storage cells are arranged in terms of added columns for each row. FIG. 3 shows a row of DRAM storage cell organized as blocks, with 32 DRAM cells per block. A block of 32 DRAM storage cells is labeled as 310 in FIG. 3. FIG. 3 also shows that in the exemplary DRAM device, column addresses A [9:3] are used to select between different blocks of DRAM storage cells through a block of circuits collectively labeled as a large multiplexor. The large multiplexor is labeled as 320 in FIG. 3. FIG. 3 also shows the implementation of two blocks of spare DRAM cells, labeled as 330. FIG. 3 further illustrates that the two blocks of spare DRAM cells can be separately selected through the use of the column address A[3] through a multiplexor circuit labeled as 340. Finally, the column address A[13] can be used to select between data from the baseline memory array or data from the spare memory cells through the multiplexor labeled as 350 in FIG. 3.

To prove the principle and operation of the present techniques, examples have been prepared. These examples are merely for illustration purposes and should not unduly limit the scope of the claims herein. One of ordinary skill in the art would recognize many variations, alternatives, and modifications.

To assist the reader, the following terms are defined as examples.

AMT: Address Match Table
CID: Chip ID
IFR: In-Field Repair

LRDIMM: Load-Reduced Dual Inline Memory Module
MB: Memory Buffer
MemBIST: Software tool to generate built in self test blocks for a memory matrix as a
VHDL model for the whole memory system.
RCD: Registering Clock Driver, Also known more simply as the "Register"
RDIMM: Registered Dual Inline Memory Module
RID: Rank ID
SPD: Serial Presence Detect
VRT: Variable Retention Time
WBA: Weak Bit Address
WBAL: Weak Bit Address List
WCM: Weak Cell Management In an example, techniques include a method that is provided within a framework wherein DRAM devices are characterized, bad cells within the DRAM devices are detected, their address locations stored in non-volatile memory locations, and the subsequent usage of the Weak Bit Address list to effect dynamic repairs that are transparent to the host memory controller. The section on MemBIST will provide descriptions of testing algorithms to detect weak cells, and the section on Weak Bit Address List storage format will specify their storage format in non-volatile memory, and the sections that describe specific repair concepts will detail the usage of the Weak Bit Address List to effect weak cell management.

In an example, the present description provides a high level architectural specification that is independent of specific DRAM types, specific DIMM types, and specific bad bit replacement concepts. It is intended that this specification will act as the master specification from which an implementation-specific architectural specification may be quickly derived.

In an example, the Externally-Addressable-Spare-Columns-in-DRAM concept is designed for implementation on a DDR3 or DDR4 Register DIMM (RDIMM) or LRDIMM. The Externally-Addressable-Spare-Columns-in-DRAM concept also utilizes a known Weak Bit Address List (WBAL) stored in one or more Address Match Tables (AMT) to compare against addresses of DRAM commands that flow through the Address and Command Path of the RDIMM or LRDIMM. In the case that a match to a known Weak Bit Address, the Address Match Table replaces the column-address of the Column-Access command with a column-address to a set of spare columns in the DRAM devices. The spare-columns are used to provide reliable storage locations for data in place of columns with known faulty or weak DRAM storage cells.

Figure 4:
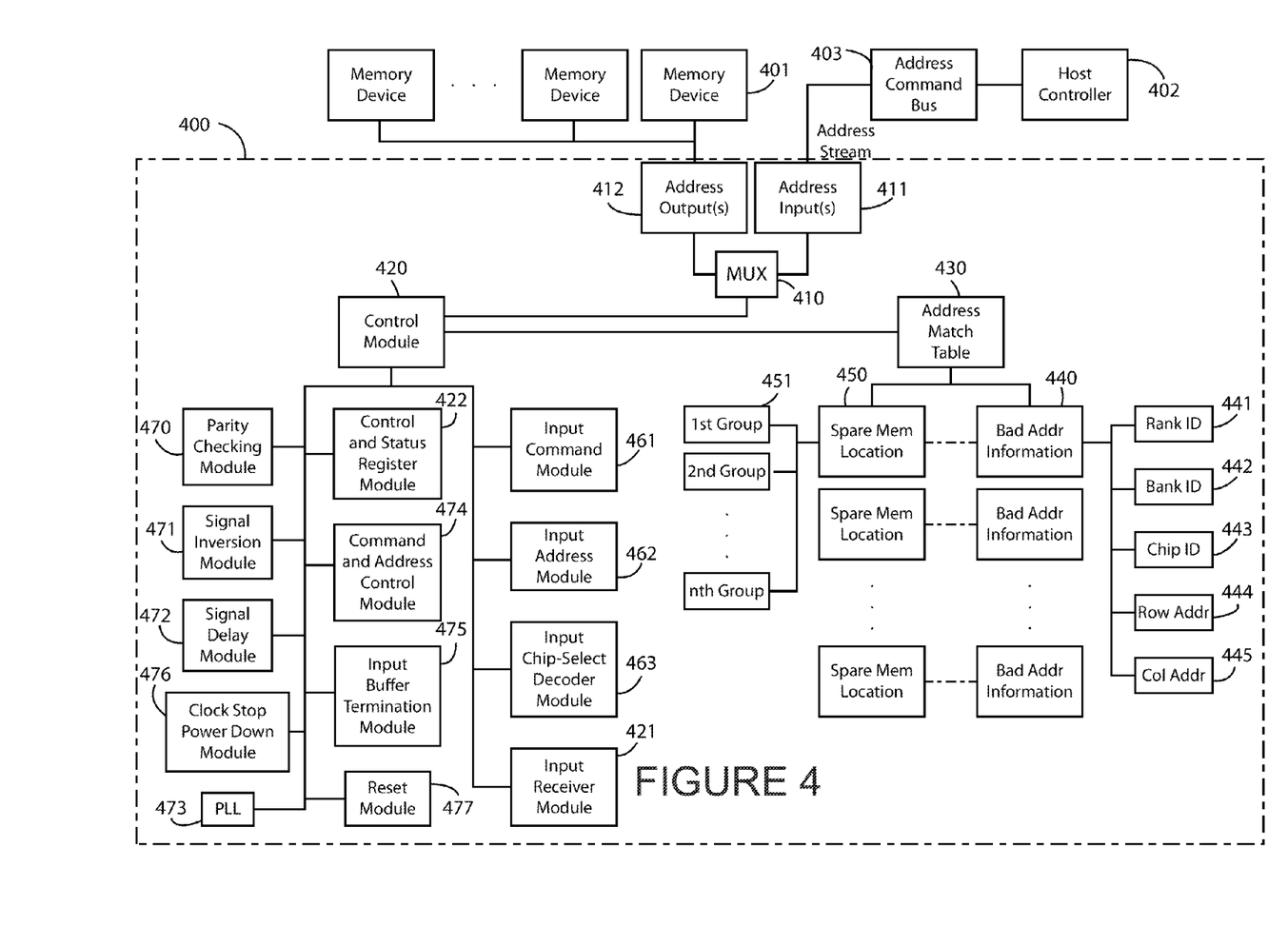
FIG. 4 illustrates a simplified block diagram of a memory interface device according to an embodiment of the present invention.

In an example, FIG. 4 illustrates a DDR4 Registered DIMM where the DDR4 Register has been modified to incorporate one or more Address Match Tables. The Address Match Tables check addresses of DRAM commands as the DRAM commands flow through the DDR4 Register against known Weak Bit Address locations. In the case of an address match, the DDR4 Register dynamically replaces the column-address of the column-access command with the address of a spare column in DRAM devices.

To facilitate the implementation of the Spare-Columns-in-DRAM concept the architectural description of the Address Match Table and Externally-Addressable-Spare-Columns-in-DRAM may be found in the following sections (1) Address Match Table; (2) Externally-Addressable-Spare-Columns-in-DRAM.

In an embodiment, the present invention provides a memory interface device. As shown in FIG. 4, the device 400 can include address input(s) 411, address output(s) 412, an address match table 420, a control module 430, and a multiplexer 410. In a specific embodiment, the memory interface device 400 can be selected from a register device, a buffer device, an advanced memory buffer, a buffer on-board, or the like and combinations thereof.

The address input(s) 411 can be configured to receive address information from an address stream of a host controller, while the address output(s) 412 can be coupled to a plurality of memory devices and be configured to drive address information. In a specific embodiment, the plurality of memory devices 401 can include a plurality of DRAM devices, Flash devices, or other like memory devices. Furthermore, the multiplexer 410 can be coupled to the address input and the address output.

The address match table 430 can include an array of SRAM cells, or the like. In a specific embodiment, this address match table 430 can include a plurality of bad address information 440 and a plurality of spare memory locations 450. Each of the plurality of bad address information 440 can be associated with one of the plurality of spare memory locations 450. Each of the plurality of bad address information can include a rank ID 441, a bank ID 442, a chip ID 443, a row address 444, and a column address 445. Additional parameters can also be included. Each of the plurality of spare memory locations can include a plurality of memory groups 451, which can include a first column, second column, and an nth column. Row and bank configurations can also be used, as various numbers and configurations of spare memory locations can be used depending on design and related applications. The address match table can be configured to receive bad address information and can be configured to transfer the spare memory location to replace the bad address associated with the bad address information.

The control module 420 can be a command and address module, or the like. This control module 420 can be integrated with the address match table. In a specific embodiment, this control module 420 can be configured to determine address information from an address stream from an address command bus 403 coupled to a host controller 402 during a run time operation. This control module 420 can be configured to compare each address from the address steam and configured to determine whether each address matches with a stored address in the address match table 430 to identify a bad address. The control module 420 can also be configured to replace the bad address with the revised address of the spare memory location 450.

In a specific embodiment, the control module 420 can include an input receiver module 421 or a control and status register module 422. The control module can also include an input command 461, an input address 462, and an input chip-select decoder module 463. Other components, such as a parity checking module 470, a signal inversion module 471, a signal delay module 472, a PLL (Phase-locked loop) 473, a command and address control module 474, an input buffer termination module 475, a clock stop power down module 476, a reset module 477, and the like, can also be included with the memory interface device 400.

In a specific embodiment, the memory interface device can be coupled to a plurality of DRAM devices. Each of these DRAM devices can include a plurality of address inputs, a plurality of control inputs, a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can include a spare row, a spare column, or a spare bank.

Figure 5:
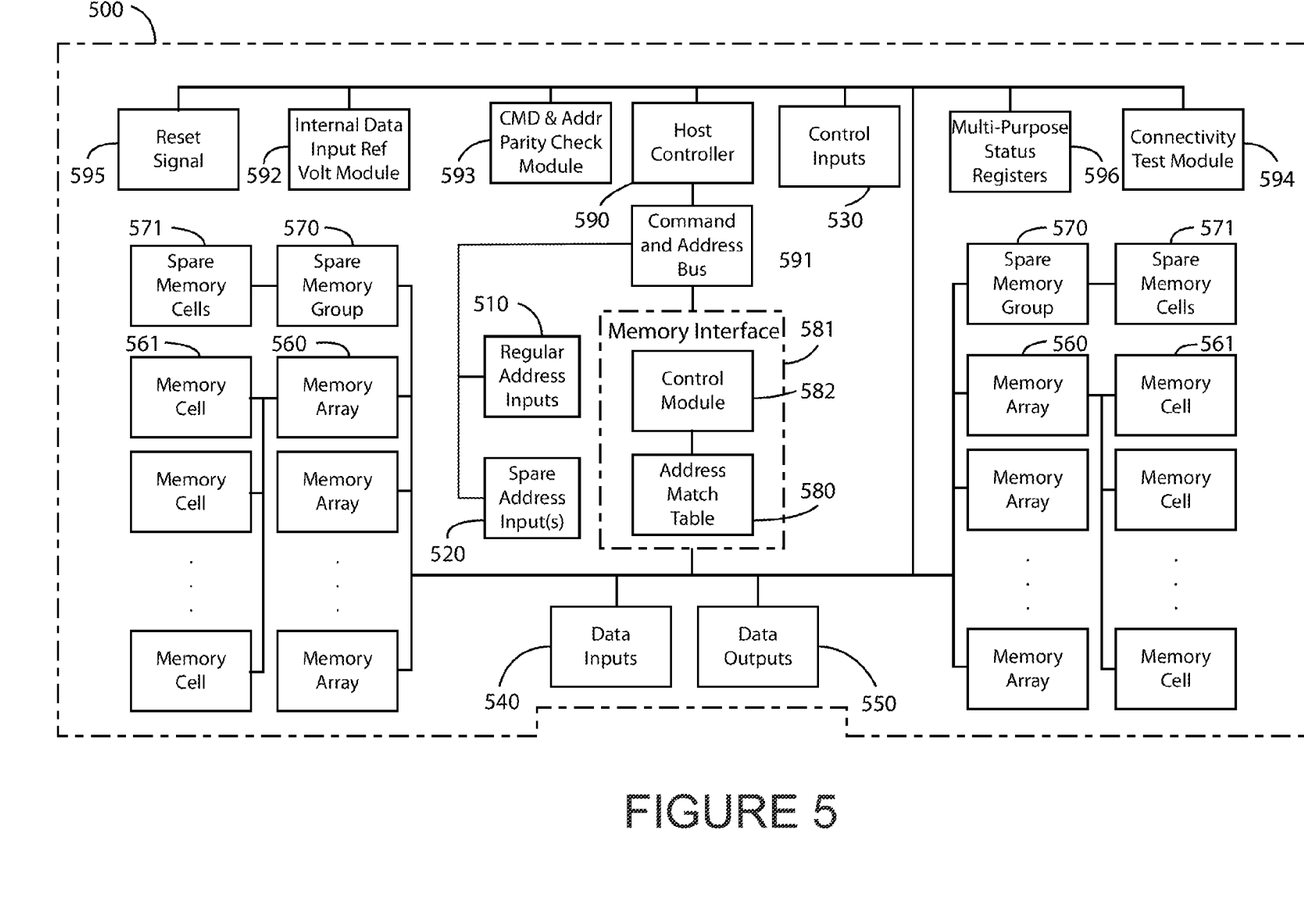
FIG. 5 illustrates a simplified block diagram of a memory integrated circuit device according to an embodiment of the present invention.

FIG. 5 illustrates a simplified block diagram of a memory integrated circuit device according to an embodiment of the present invention. As shown, this device 500 can include a plurality of regular address inputs 510, at least one spare address 520 configured for a selected mode or an unselected mode, a plurality of control inputs 530, a plurality of data inputs 540, a plurality of data outputs 550, a plurality of memory arrays 560, and a spare group of memory cells 570.

In a specific embodiment, each of the plurality of memory arrays 560 can include a plurality of memory cells 561. Each of these memory cells can be coupled to a data input/output 540/550. Also, the spare group of memory cells 570 can include a plurality of spare memory cells 571. The spare group of memory cells 571 can include a spare column, a spare row, a spare bank, or the like. Each of these memory cells 571 can be externally addressable using an address match table 580 and can be configured with the spare address input 520. The spare address input 520 can be coupled to the address match table 580 to access the spare memory cells 571. The address match table 580 can be provided within a memory interface device 581 with a control module 582. This memory interface 581 can be similar to that described for FIG. 4 above. In a specific embodiment, the spare address input 520 can include one of three unused column address inputs A11, A13, and A17.

In a specific embodiment, the plurality of spare memory cells 571 can be accessed from the group of memory cells 570 using the spare address input 520 during the selected mode. During a read operation, data from the accessed spare memory cell 571 can be transferred to one of the plurality of data outputs 550. During a write operation, data from one of the plurality of data inputs 540 can be transferred into the accessed spare memory cell 571. During the unselected mode, the spare address input 520 can remain inactive while the plurality of regular address inputs 510 remains active.

Also, the spare group of memory cells 570 can include various configurations of spare columns and spare address inputs. For example, the spare group 570 can include first through seventh spare columns, and the spare address input can include first through third spare address inputs. Or, the spare group can include first through third spare columns, and the spare address input can include a first and second spare address input. Other variations, modifications, and alternatives to these configurations can be used.

The memory integrated circuit device 500 can also include an encoded command and address bus 591 having a shared command signal and an address signal, an internal data input reference voltage circuit 592, a command and address parity checking circuit 593 a set of circuits designed to support connectivity testing 594, a reset input signal 595, a set of multi-purpose status registers 596 configured to be read out, or the like and combinations thereof. These modules and circuits can be coupled to a host controller 590. Those of ordinary skill in the art will recognize other variations, modifications, and alternatives.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

In an example, the present invention provides a method for operating a memory interface device, as outlined below.

1. Receive, at an address input(s) of a memory interface device, address information from an address stream of a host computer;

2. Process the address stream from an address command bus coupled to the host controller during a run time operation;

3. Compare successively each address from the address stream from information in an address match table to determine to whether an address matches with a stored address in an address match table;

4. Identify a bad address provided in the address match table; and

5. Replace the bad address with a revised address of a spare memory location;

6. Transfer the revised address to a multiplexer coupled to the address output;

7. Drive address information from an address output(s) of the memory interface device to a plurality of memory devices; and 8. Perform other steps, as desired.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

Figure 6:
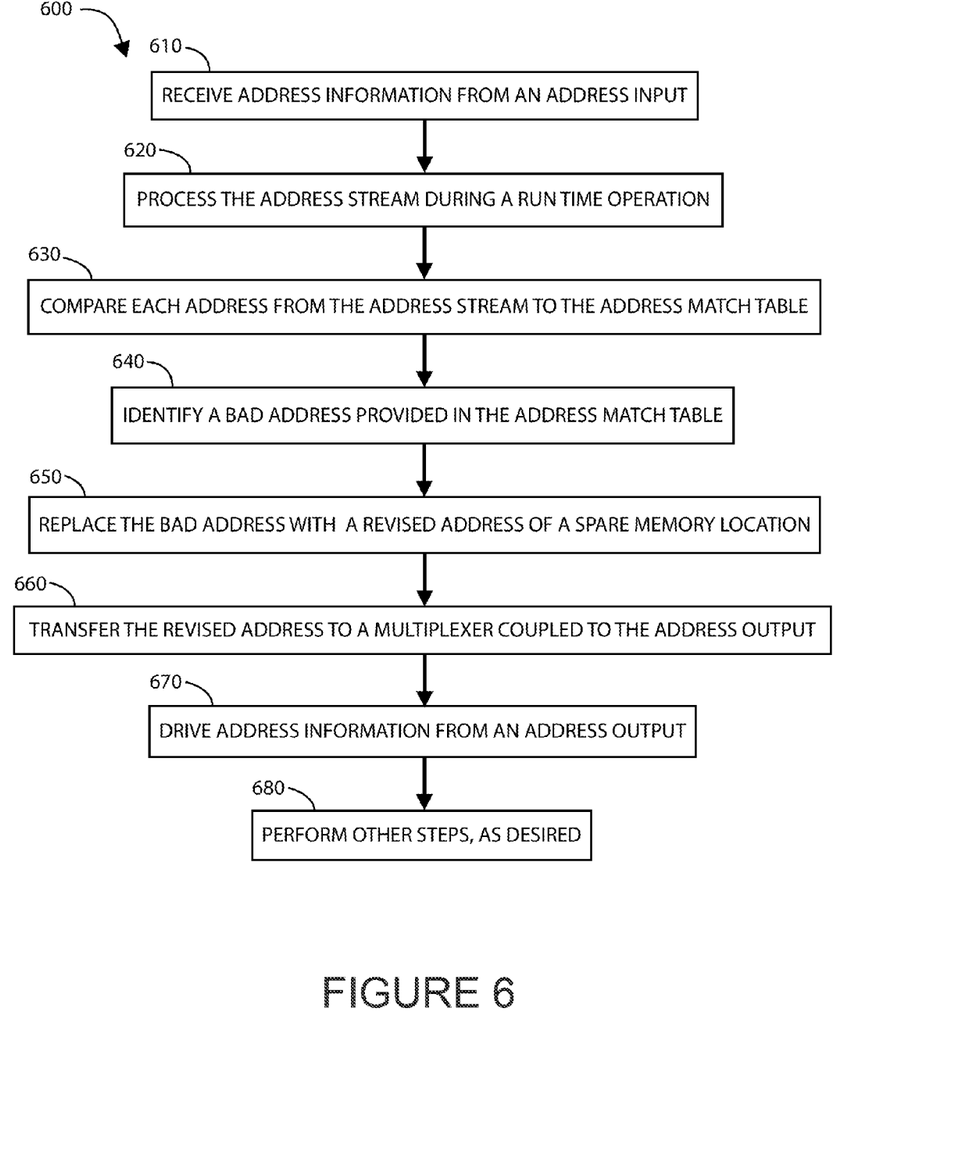
FIG. 6 illustrates a simplified flow diagram for operating the Address Match Table according to an embodiment of the present invention.

FIG. 6 illustrates a simplified flow diagram for operating an address match process for replacing a bad cell with a spare cell according to an embodiment of the present invention. As shown, method 600 can begin with receiving, at address input or inputs of a memory interface device, address information from an address stream of a host computer, step 610. This memory interface device can be coupled to a host computer. The memory interface device can be selected from a register device, a buffer device, an advanced memory buffer, or a buffer on-board. These memory devices can include a plurality of DRAM devices, Flash devices, or other like devices and combinations thereof.

During a run time operation, the address stream from an address command bus coupled to the host controller can be processed, step 620. Each address from the address stream can be compared successively to determine whether an address matches with a stored address in an address match table, step 630. The address table can include a plurality of SRAM cells and can include a plurality of bad address information and a plurality of spare memory locations. Each of these bad address locations can be associated with one of the spare memory locations. Each of the bad address information can include a rank ID, a bank ID, a chip ID, a row address, and a column address. Each of the spare memory locations can include one or more memory groups, which can include columns, rows, or banks, and the like. In a specific embodiment, each of the spare memory locations can include a first, second, and an nth column.

A bad address in the address match table can be identified, step 640, and can be replaced with a revised address of a spare memory location, step 650. The revised address can be transferred to a multiplexer coupled to the address output, step 660. The address match table can be configured to receive bad address information and transfer the spare memory location to replace the bad address associated with the bad address information. Also, method 600 can include driving address information from an address output or outputs of the memory interface device to a plurality of memory devices, step 670.

In a specific embodiment, the comparing, identifying, and replacing can be under control of a control module. This control module can be integrated with the address match table and can further include an input receiver module, a control and status register module, an input command module, and input address module, and an input chip-select decoder module, and other like modules. Further details regarding components of these devices and process are described previously for FIGS. 1-5. Furthermore, other steps can be performed as desired according to various specifications and applications, step 680.

Figure 7:
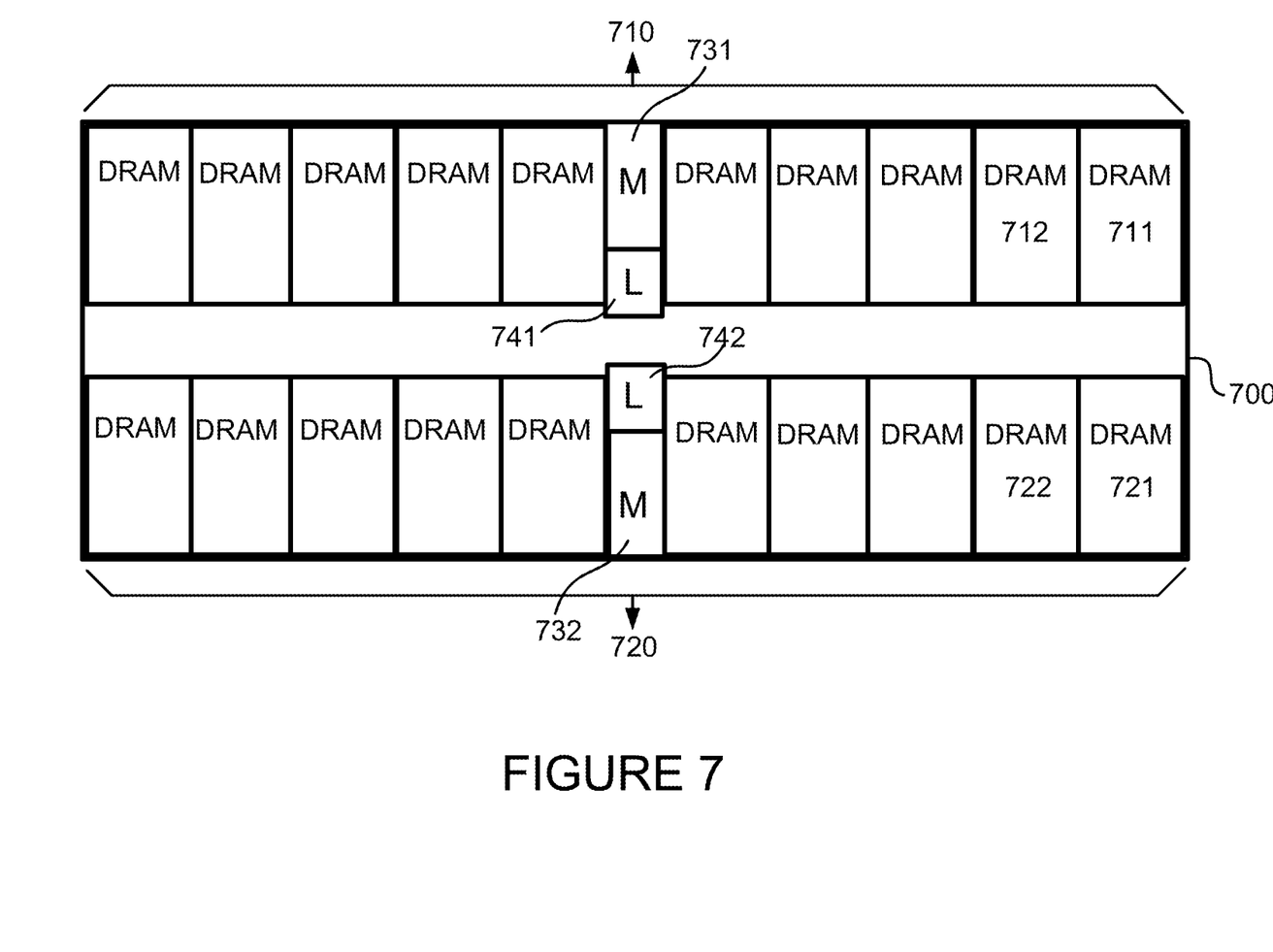
FIG. 7 illustrates a simplified block diagram of an integrated DRAM memory chip according to an embodiment of the present invention.

FIG. 7 illustrates a simplified block diagram of an integrated DRAM memory chip according to an embodiment of the present invention. As shown, the integrated DRAM memory chip 700 is a single chip with multiple arrays of DRAM devices without conventional spare memory rows and columns, a dedicated spare memory device, and a logic circuitry associated with the dedicated spare memory device, configured to replacing any weak cell within any one DRAM device in the chip. In an embodiment, within each DRAM device 711 (or 712, 721, 722 . . . ) of an DRAM array 710 in this integrated memory chip 700 the area conventionally for spare memory rows and columns has been recovered into the total (enlarged) memory size. Instead of using spare rows (or columns) in individual DRAM device, the dedicated spare memory device 731 is disposed into a middle region of the array of DRAM devices 710 and can be dynamically shared by the array of DRAM devices 710 for repairing the weak cells therein. Similarly, another dedicated spare memory device 732 is added and shared with another array of DRAM devices 720 while the conventional spare memory rows and columns within each DRAM device 721 or 722 . . . have been eliminated. In an embodiment, each DRAM device is substantially same as the Memory Array 560 in the memory integrated circuit device 500 illustrated in FIG. 5. In another embodiment, the dedicated spare memory device 731 is substantially same as the Spare Memory Group 570 associated with the plurality of Memory Array 560 illustrated in FIG. 5.

In another embodiment, the dedicated spare memory device 731 (or 732) is associated with a logic circuitry 741 (or 742) including a match table and weak cell replacement logic which can have desired byte, nibble, bit granularity. In a specific implementation, the dedicated spare memory device is a DRAM device without weak cells. For example, the dedicated spare memory device 731 (or 732) can be made by a DRAM device with 40 nm or bigger features. In another example, the dedicated spare memory device 731 (or 732) is formed by memory made with a different process, such as SRAM, that is immune to weak cell problem. Accordingly, the logic circuitry 741 (or 742) is configured to function as a match table in conventional weak-cell replacement scheme to cause an address to a defective cell to be rerouted to a particular cell within the dedicated spare memory device 731 (or 732). In another specific implementation, the logic circuitry is preferably made from non-volatile memory device or SRAM with desired byte, nibble or bit granularity. In a specific implementation, the dedicated spare memory device 731 is configured to be substantially same as the Spare Memory Group 570 including a plurality of Spare Memory Cells 571 illustrated in FIG. 5. In another implementation, the logic circuitry 741 functions substantially same as the memory interface device 400 illustrated in FIG. 4, which is configured to allow both conventional memory logic for Read/Write operation and a replacement logic for address rerouting operation to replace weak cells in any DRAM device formed in the same single chip 700.

Figure 8:
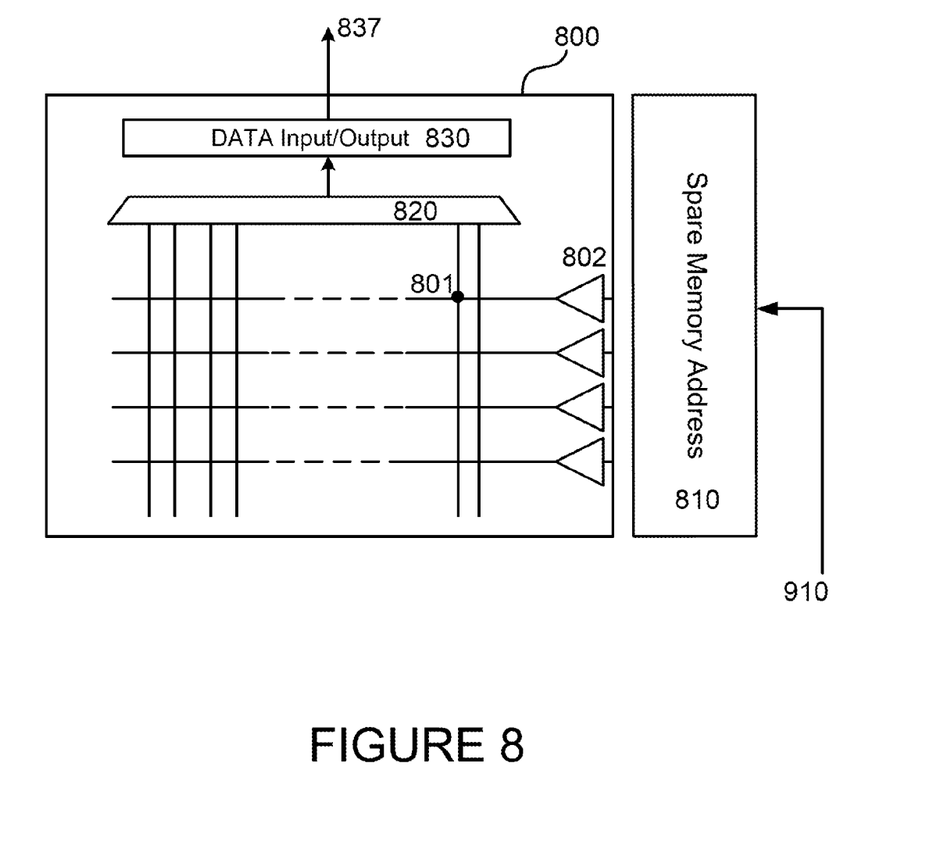
FIG. 8 illustrates a simplified block diagram of an array of dedicated spare memory cells for replacing defective cells in any of DRAM devices in FIG. 7 according to an embodiment of the present invention.

FIG. 8 illustrates a simplified block diagram of an array of dedicated spare memory cells for replacing defective cells in any of DRAM devices in FIG. 7 according to an embodiment of the present invention. This diagram is merely an example, which should not unduly limit the scope of the claims herein. One in ordinary skilled of the art should recognize many alternatives, variations, and modifications. As shown, the dedicated spare memory chip 800 is another DRAM which can be made by bigger feature size to substantially reduce chance of weak cell formation. It can be also made by a deferment type of memory, i.e. SRAM, which immune from weak cell problem. Using DRAM as an example, the spare memory chip 800 is configured to receive revised address information 910 based on a comparison between a target DRAM column address and a weak cell address list. This revised address information is loaded into the spare memory address selector 810 which assigns replacement cells with row address 802 and column address 801 in the spare memory chip 800 that can be used for repairing the weak cells in the target DRAM device (any one in DRAM array 710 or 720 of FIG. 7). In a specific embodiment, Read/Write requests within the spare memory chip 800 are processed by conventional memory logics but with a byte-granularity replace logic in parallel. In other words, the replacement cells can be used in unit of byte for repairing the weak cells in the target DRAM instead of replacing the whole row of cells as in conventional application. Once the replacement cells are determined, their data stored therein can be read and transferred through a MUX data selector 820 to send to Data output 830, and further to data bus 837 that merged with data from those good cells from the target DRAM (in the same single chip 700).

Figure 9:
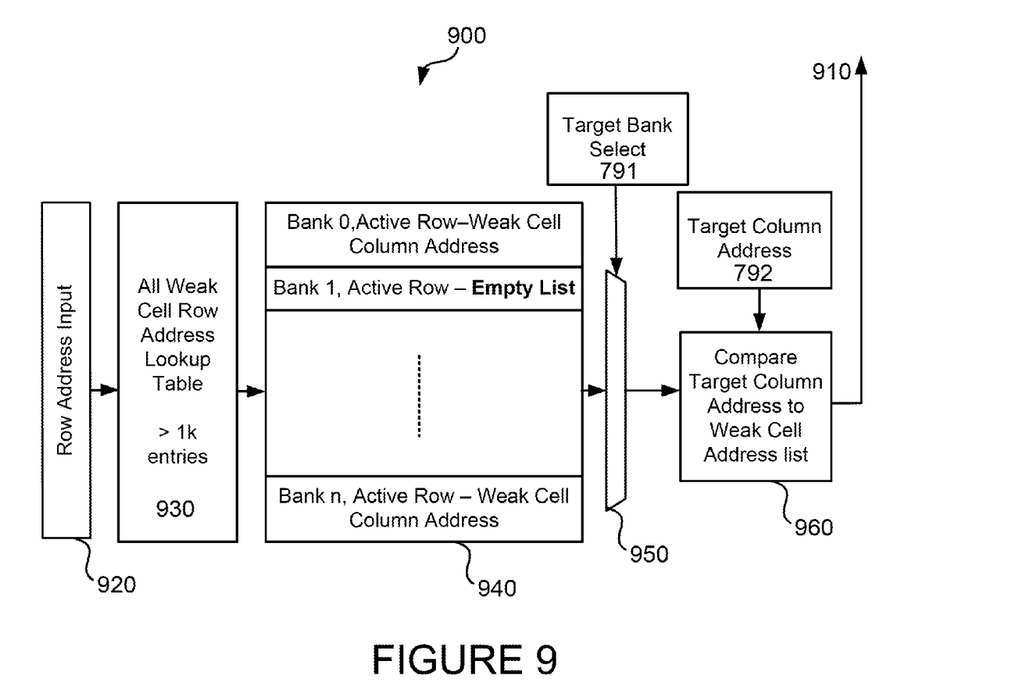
FIG. 9 illustrates a simplified block diagram of a logic circuitry for causing address to a defective cell in any DRAM devices of FIG. 7 to be rerouted to a particular cell in the array of dedicated spare memory cells according to an embodiment of the present invention.

FIG. 9 illustrates a simplified block diagram of a logic circuitry for causing address to a defective cell in any DRAM devices of FIG. 7 to be rerouted to a particular cell in the array of dedicated spare memory cells according to an embodiment of the present invention. This diagram is merely an example, which should not unduly limit the scope of the claims herein. One in ordinary skilled of the art should recognize many alternatives, variations, and modifications. As shown, the logic circuitry 900 is configured to receive row address information 920 from data input(s) 540 (see FIG. 5). The row address is loaded into a weak-cell row address look-up table 930 to determine if there is any row address match between the row address input 920 with the stored weak cell row address in the match table (which can be more than 1000 pre-stored entries (see match table 580 in FIG. 5). Further, the row address match result is sent to a multi-bank active row weak cell column address table 940 to determine the column address of the weak cells located in which bank (from banks number 0 through n). Then the output of the column address match is combined by a multiplexer 950 with target bank select information 791 (which is associated with the target DRAM that has weak cells need repair) and the muxed data is sent to a logic device 960 (within a controller 580 in FIG. 5). The logic device 960 is configured to receive target column address information 792 so that the data containing weak cell address (both row and column addresses) list can be compared with the target column address information to generate a revised address information 910 being sent to the dedicated spare memory chip (800 shown in FIG. 8). In a specific embodiment, spare memory chip 800 is couple to the logic circuitry 900 to use match table and weak cell replacement logic to generate revised addresses for replacing bad addresses with byte granularity. The weak cells in the target DRAMs can be dynamically replaced in unit of byte by the replacement cells in the dedicated spare memory chip that is built in s single chip with those target DRAMs. As used herein, the term "bad cell" includes either weak and/or faulty cells, or the like.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that the description recited above is an example of the disclosure and that modifications and changes to the examples may be undertaken which are within the scope of the claimed disclosure. Therefore, the scope of the appended claims should be accorded the broadest interpretation so as to encompass all such modifications and similar arrangements, including a full scope of equivalents.

The invention claimed is:

1. A memory device comprising:
an interface device comprising:
an address input(s) configured to receive address information from an address stream of a host controller;
an address output(s) configured to drive address information;
an address match table comprising at least a revised address corresponding to a spare memory location;
a control module configured to determine address information from the address stream from an address command bus coupled to the host controller during a run time operation, the control module configured to compare each address from the address stream and determine whether each address matches with a stored address in the address match table to identify a bad address and configured to replace the bad address with the revised address of the spare memory location;
a multiplexer coupled to the address input and coupled to the address output;
a plurality of address inputs;
a plurality of control inputs;
a plurality of data input/outputs;
a plurality of memory arrays, each of the memory arrays comprising a plurality of memory cells, each of the plurality of memory cells being coupled to a data input/output and free from any spare memory cells; and
a spare group of memory cells comprising a plurality of spare memory cells separate from each of the plurality of memory arrays, each of the plurality of spare memory cells being dynamically addressable using the address match table by the plurality of memory arrays.

2. The memory device of claim 1 wherein the interface device is selected from a register device, a buffer device, an advanced memory buffer, or buffer on-board.

3. The memory device of claim 1 wherein the memory device is a DRAM device or a Flash device.

4. The memory device of claim 1 wherein the address match table comprises a plurality of bad address information and a plurality of spare memory locations, each of the bad address information is associated with one of the spare memory locations.

5. The memory device of claim 4 wherein each of the plurality of bad address information comprises a rank ID, bank ID, chip ID, a row address, and a column address in one memory cell of the plurality of memory arrays.

6. The memory device of claim 4 wherein each of the spare memory locations comprises a first column, a second column, and an nth column associated with the revised addresses in the spare group of memory cells.

7. The memory device of claim 4 wherein the address match table comprises an array of SRAM cells.

8. The memory device of claim 4 wherein the address match table is configure to receive bad address information and transfer the spare memory location to replace the bad address associated with the bad address information.

9. The memory device of claim 1 wherein the control module is a command and address control module; and the control module is integrated with the address match table.

10. The memory device of claim 1 wherein the control module comprises an input receiver module.

11. The memory device of claim 1 wherein the control module further comprising a control and status register module.

12. The memory device of claim 1 wherein the control module further comprising an input command, input address, and input chip-select decoder module.

13. The memory device of claim 1 further comprising a parity checking module; a signal inversion module; a signal delay module; a PLL; a command and address control module; an input buffer termination module; and a clock stop power down module.

14. The memory device of claim 1 further comprising a reset module; wherein the spare group of memory cells is selected from a spare column, a spare row, or a spare bank dynamically shared with the plurality of memory arrays.

15. The memory device of claim 1 wherein the at least one spare address input comprises one of three unused column address inputs A11, A13, and A17.

16. The memory device of claim 1 wherein during the selected mode at least one of the plurality of spare memory cells being accessed using the spare address input; whereupon during a read operation data from the accessed spare memory cell is transferred to one of the plurality of data outputs; or whereupon during a write operation data from one of the plurality of data inputs is transferred into the accessed spare memory cell.

17. The memory device of claim 1 wherein during the unselected mode the spare address input is inactive; and wherein the plurality of regular address inputs are active.

18. The memory device of claim 1 wherein the spare group of memory cells is grouped in byte and comprises a first spare column, a second spare column, a third spare column, a four spare column, a fifth spare column, a sixth spare column, and a seventh spare column; wherein the at least one spare address input comprises a first spare address input, a second spare address input, and a third spare address input.

19. The memory device of claim 1 wherein the spare group of memory cells comprises a first spare column, a second spare column, and a third spare column; wherein the at least one spare address input comprises a first spare address input and a second spare address input; and further comprising an encoded command and address bus having a shared command signal and address signal.

20. The memory device of claim 1 further comprising of an internal data input reference voltage circuit; a command and address parity checking circuit; a set of circuits designed to support connectivity testing; a reset input signal; and a set of multi-purpose status registers configured to be read out.

* * * * *